(12) United States Patent
Mashkin et al.

(10) Patent No.: US 11,940,499 B2
(45) Date of Patent: Mar. 26, 2024

(54) METHOD FOR THE -DESTRUCTIVE DETECTING OF AGEING SYMPTOMS OF A COMPONENT HAVING REGULARLY RECURRING STRUCTURES

(71) Applicant: Siemens Energy Global GmbH & Co. KG, Bayern (DE)

(72) Inventors: Andrey Mashkin, Cologne (DE); Daniel Hansmann, Herten (DE); Friedhelm Pohlmann, Essen (DE); Guido Schmidt, Leichlingen (DE)

(73) Assignee: Siemens Energy Global GmbH &Co. KG, Bayem (DE)

( * ) Notice: Subject to any disclaimer, the term of this patent is extended or adjusted under 35 U.S.C. 154(b) by 345 days.

(21) Appl. No.: 17/431,159

(22) PCT Filed: Jan. 20, 2020

(86) PCT No.: PCT/EP2020/051251
§ 371 (c)(1),
(2) Date: Aug. 14, 2021

(87) PCT Pub. No.: WO2020/169286
PCT Pub. Date: Aug. 27, 2020

(65) Prior Publication Data
US 2022/0146579 A1   May 12, 2022

(30) Foreign Application Priority Data
Feb. 22, 2019   (DE) ...................... 10 2019 202 420.3

(51) Int. Cl.
*G01R 31/12* (2020.01)
*G01R 31/308* (2006.01)
(Continued)

(52) U.S. Cl.
CPC ......... *G01R 31/346* (2013.01); *G01R 31/308* (2013.01); *G06T 7/0006* (2013.01);
(Continued)

(58) Field of Classification Search
CPC .. G01R 31/308; G01R 31/346; G06T 7/0004; G06T 7/0006; G06T 7/97;
(Continued)

(56) References Cited

U.S. PATENT DOCUMENTS 3,774,030 A * 11/1973 O'Connor ............... G01N 21/89
250/363.01
10,546,372 B2 * 1/2020 Duckworth ......... G01M 5/0033
(Continued)

FOREIGN PATENT DOCUMENTS

DE   102008046698 A1   3/2010
DE   102016212134 A1   1/2018
EP      3249657 A1   11/2017

OTHER PUBLICATIONS

International search report and written opinion dated Jun. 30, 2020 for corresponding PCT/EP2020/051251.

*Primary Examiner* — Thang X Le
(74) *Attorney, Agent, or Firm* — Wolter Van Dyke Davis, PLLC

(57) ABSTRACT

A method for the non-destructive detecting of ageing symptoms of a component having regularly recurring structures, includes the following steps: a) scanning the component in the region of the recurring structures in a plurality of scanning planes which extend parallel to one another to create at least one scanning image set having a plurality of two-dimensional scanning images, wherein the scanning images show a plurality of inhomogeneities; b) automatically identifying those inhomogeneities that form recurring patterns, and those inhomogeneities that do not follow a recurring pattern, using a suitable algorithm; and c) detect-
(Continued)

ing ageing symptoms exclusively on the basis of those inhomogeneities which are identified in step b) and do not follow a recurring pattern.

13 Claims, 6 Drawing Sheets

(51) Int. Cl.
  *G01R 31/34* (2020.01)
  *G06T 7/00* (2017.01)
  *H02K 3/32* (2006.01)
  *H02K 15/00* (2006.01)

(52) U.S. Cl.
  CPC .............. *G06T 7/97* (2017.01); *H02K 3/32* (2013.01); *H02K 15/00* (2013.01); *G06T 2207/30144* (2013.01)

(58) Field of Classification Search
  CPC ........... G06T 2207/30108; G06T 2207/30144; H02K 15/00
  See application file for complete search history.

(56) References Cited

U.S. PATENT DOCUMENTS

| | | |
|---|---|---|
| 2007/0009086 A1 | 1/2007 | Yoshino |
| 2009/0066939 A1 | 3/2009 | Venkatachalam et al. |
| 2009/0183991 A1* | 7/2009 | Yamamoto ............. C25D 21/12 428/601 |
| 2011/0089954 A1* | 4/2011 | Wang .................. G01R 31/346 382/190 |
| 2012/0294508 A1* | 11/2012 | Wada ................... G06T 7/0008 382/150 |
| 2018/0172601 A1* | 6/2018 | Wild ................. G01N 21/8914 |

* cited by examiner

METHOD FOR THE -DESTRUCTIVE DETECTING OF AGEING SYMPTOMS OF A COMPONENT HAVING REGULARLY RECURRING STRUCTURES

CROSS REFERENCE TO RELATED APPLICATIONS

This application is the US National Stage of International Application No. PCT/EP2020/051251 filed 20 Jan. 2020, and claims the benefit thereof. The International Application claims the benefit of German Application No. DE 10 2019 202 420.3 filed 22 Feb. 2019. All of the applications are incorporated by reference herein in their entirety.

FIELD OF INVENTION

The invention relates to a method for the non-destructive detection of signs of aging of a component having regularly recurring structures, in particular wound insulation, such as, for example, stator winding insulation, and to a device which is set up to perform such a method.

BACKGROUND OF INVENTION

The winding bars of generators, such as, for example, those of turbo and water power generators, are provided with insulation. This stator winding insulation normally comprises multiple insulating tape layers wound around the stator winding bar, which are impregnated with a resin. The stator winding bar serves as a winding bar for the insulation. During the generator operation, a structural change, which is brought about by electrical, thermal, mechanical and chemical stresses, takes place in the stator winding insulation. Accelerated signs of aging of the insulation, leading to damage in the long term, are the consequence, for example in the form of micro-cracks or delaminations. To avoid damage to the generator, it is necessary to detect such signs of aging and their extent as early as possible and, if possible, to eliminate them in good time. Against this background, stator winding insulation is checked at regular time intervals and repaired if necessary.

The detection of signs of aging of stator winding insulation is currently carried out, for example, by using so-called partial discharge measurement. However, this tried and tested method, which generally counts as an integral measurement, can cover only those regions of stator winding insulation in which the electric field is sufficiently highly pronounced, that is to say those regions in which the winding bars are arranged in the generator grooves, and the regions under the respective end corona protection, comprising approximately 30% of the front insulation length. Signs of aging also occur in the remaining regions of the winding bars, however, so that signs of aging are not completely detectable. In addition, localization of detected signs of aging is not possible to the required extent in the partial discharge measurement, since the accuracy of the propagation time measurement of the partial discharge pulses is approximately 1.2 meters.

A further known possibility for the detection of signs of aging of stator winding insulation constitutes high-voltage testing which, however, when significant signs of aging are present, can lead to a breakdown which is no longer repairable.

Further known techniques for component testing are terahertz, ultrasound or tomography testing techniques, in which the component to be tested in scanned with the production of scanning images. However, these techniques are not used for the non-destructive detection of signs of aging of stator winding insulation, since the very complex winding structure of the insulation can also be seen on the scanning images, which leads to it being very difficult to distinguish signs of aging from the winding structure and, accordingly, barely being able to identify them.

In many further components of a generator, there are similar difficulties in distinguishing signs of aging from the component structure itself. Thus, for example, mechanical supporting rings on the generator stator and bandage caps on the generator rotor are produced from fiber bundles, tapes or webs with a resin impregnation wound onto a mandrel. Their electrical testing is not possible because of the weak electrical fields, and ultrasound testing is not plausible because of the many reflections. This is similarly true of components which are produced from polymers or metals by using an additive manufacturing method, for example fan blades which, in the interior, have a supporting structure comprising a multiplicity of supports defining a three-dimensional lattice structure. Here, too, damage analysis by means of ultrasound or the like is not plausible because of the large number of reflections.

SUMMARY OF INVENTION

Starting from this prior art, it is an object of the present invention to devise an alternative method for the non-destructive detection of signs of aging of a component having regularly recurring structures.

To achieve this object, the present invention devises a method for the non-destructive detection of signs of aging of a component having regularly recurring structures, comprising the steps: a) scanning the component in the region of the recurring structures in a plurality of scanning planes which extend parallel to one another, creating at least one scanning image set having a plurality of two-dimensional scanning images, wherein the scanning images show a multiplicity of inhomogeneities; b) automatically identifying those inhomogeneities that form recurring patterns and those inhomogeneities that do not follow a recurring pattern, using a suitable algorithm; and c) detecting signs of aging exclusively on the basis of those inhomogeneities identified in step b) that do not follow a recurring pattern.

According to the invention, in the first step a), scanning of the component in the region of the recurring structures is thus carried out in the depth direction of the insulation, which is frequently also designated as a depth sweep. Here, at least one scanning image set is produced, the two-dimensional scanning images of which were created in different scanning planes in each case. These scanning images have a large number of inhomogeneities, which can represent potential signs of aging but for the most part are caused by the complex recurring structures of the component. Accordingly, signs of aging that are actually present can be identified only with difficulty. For this reason, in step b), by using a suitable algorithm, there follows an identification of those inhomogeneities that form recurring patterns and those inhomogeneities that do not follow a recurring pattern. The inhomogeneities forming recurring patterns represent inhomogeneities which can be attributed to the recurring structure of the component, such as, for example, to the winding structure of a winding. Then, in step c), signs of aging are detected exclusively on the basis of those inhomogeneities identified in step b) that do not follow a recurring pattern. In other words, the inhomogeneities that form recurring patterns are ignored during the detection of signs of aging, so that signs of aging are detected only from the set of remaining inhomogeneities. In this way, despite the very complex component structure, it is possible to detect and to evaluate existing signs of aging of the component very reliably. On the basis of the assessment, it is then possible to decide whether repair measures have to be taken or not.

According to one refinement of the method according to the invention, the regularly recurring structures are one or more winding layers wound around a winding bar, in particular the winding layers of an insulating tape of stator winding insulation, the tape layers of a rotor cap or the like.

According to a further refinement of the method according to the invention, the regularly recurring structures are multi-dimensionally produced structures, in particular 3D-printed rib, support, spring or supporting elements or structures which define cavities or channels, wherein the regularity and the recurring character are based in particular on a corresponding 3D model.

The scanning in step a) is advantageously carried out by using a terahertz, ultrasound or tomography testing technique or an optical analysis in accordance with reflection, absorption or transmission methods, or a combination of a plurality of these methods and techniques.

According to one refinement of the method according to the invention, the scanning image set produced is assigned to a specific region of the component. This assignment can be made, for example, on the basis of the position of the scanning head at the time of the scanning operation and on the basis of the size of the image region of the scanning images. In this way, signs of aging detected in step c) can be localized unambiguously on the component.

According to a variant of the method according to the invention, the detection carried out in step c) can be done visually by a person, wherein during the detection the inhomogeneities identified in step b) which follow a recurring pattern can be masked out of the scanning images or specially marked, in order to make it easier for the person to detect signs of aging.

The scanning images of the at least one scanning image set can be displayed to the person carrying out the detection above one another and/or under one another on a monitor, which makes the detection easier. In particular, it is thus simply possible to detect whether inhomogeneities identified on various scanning images of a scanning image set that do not follow a recurring pattern are an individual sign of aging which extends through multiple scanning planes or are different signs of aging.

According to a further variant of the invention, the detection carried out in step c) is done automatically by using a further algorithm, which can represent part of that computer program which also includes the algorithm used in step b). Accordingly, any subjective influence of a person on the detection result is ruled out. The algorithm can make access to databases, pattern recognition logic, data analyses or the like which make it possible to identify and possibly to assess the type of signs of aging, based on the type of inhomogeneities and their position. Alternatively or additionally, the algorithm can make access to a 3D model of the component or recurring structures to be expected, to the position of the scanning image sets, to operating data of the component, to production, model, fault and/or image databases, individually or in combination, or use corresponding information.

Advantageously, the inhomogeneities identified in step b) that do not follow a recurring pattern are optically highlighted in the scanning images, in particular marked in color. Therefore, the signs of aging are easily detectable for a person studying the scanning images.

Preferably, the position and/or type and/or extent of the signs of aging detected in step c) are identified and stored, wherein this identification can be made manually or automatically, i.e. with computer assistance. The identification permits improved assessment as to whether repair work has to be carried out promptly or not. The storage permits documentation of the damage history and/or the change over time of individual signs of aging.

Furthermore, it is possible to use information about those inhomogeneities that form recurring patterns for the simulation of the component structures and for their quality-assuring analysis.

BRIEF DESCRIPTION OF THE DRAWINGS

Further features and advantages of the present invention will become clear by using the following description of a method according to one embodiment of the present invention with reference to the appended drawing, in which:

FIG. 1 shows a partial view of a winding bar as an insulating tape is wound on;

DETAILED DESCRIPTION OF INVENTION

Figure 1:
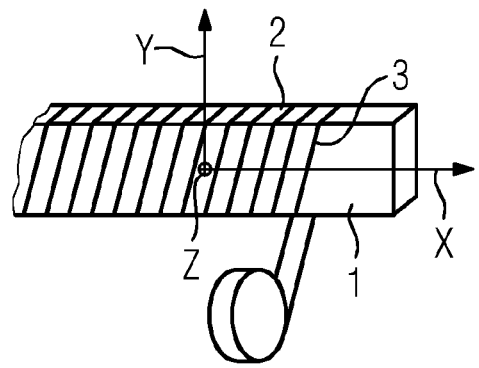

FIG. 1 shows a partial view of a winding bar 1, for example in the form of a generator winding bar, as an insulating tape 2 is wound on during the new production of stator winding insulation. In the coordinate system drawn, the X direction corresponds to the axial direction of the winding bar 1, the Y direction to the width direction of the winding bar 1, and the Z direction to the radial direction or the thickness direction of the insulating tape 2. As the insulating tape 2 is wound onto a straight section of the winding bar 1, the X direction thus remains constant, while the Y direction and the Z direction change, depending on the side of the winding bar 1 which is currently being wound around. The insulating tape 2, which normally has a tape width B between 15 and 40 mm, is wound in such a way that the insulating tape edges 3 form an angle α of about 5° with the Y direction, the respective windings being arranged to overlap one another in the X direction, which results in overlaps of length L and overlap gaps of length A.

FIGS. 2 to 7 show by way of example various winding patterns which can be produced as the insulating tape 2 is wound onto a winding bar 1.

Figure 2:
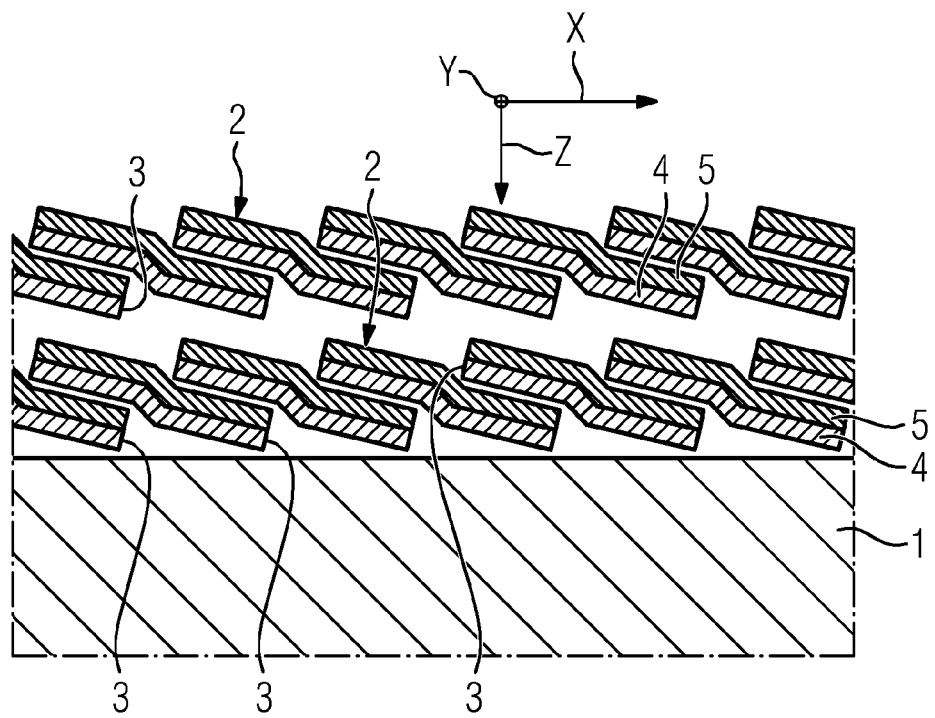
FIG. 2 shows a schematic sectional view of a subregion of an insulated winding bar, which shows a first winding pattern.
Figure 3:
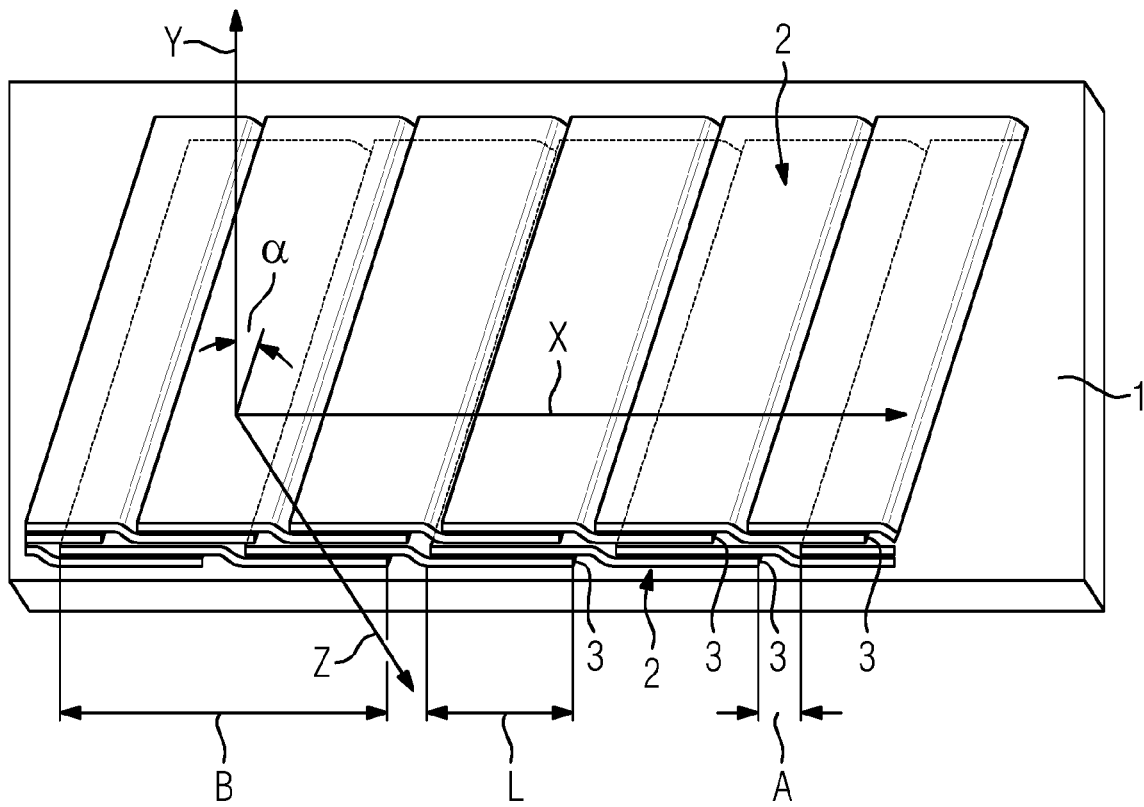
FIG. 3 shows a schematic perspective view of the subregion shown in FIG. 2.

FIGS. 2 and 3 show a winding bar 1 onto which two insulating tapes 2, which are each formed in two layers and have a lower mica layer 4 and an upper glass fabric support layer 5, were wound successively in the positive X direction in such a way that they are positioned above one another in the Z direction.

Figure 4:
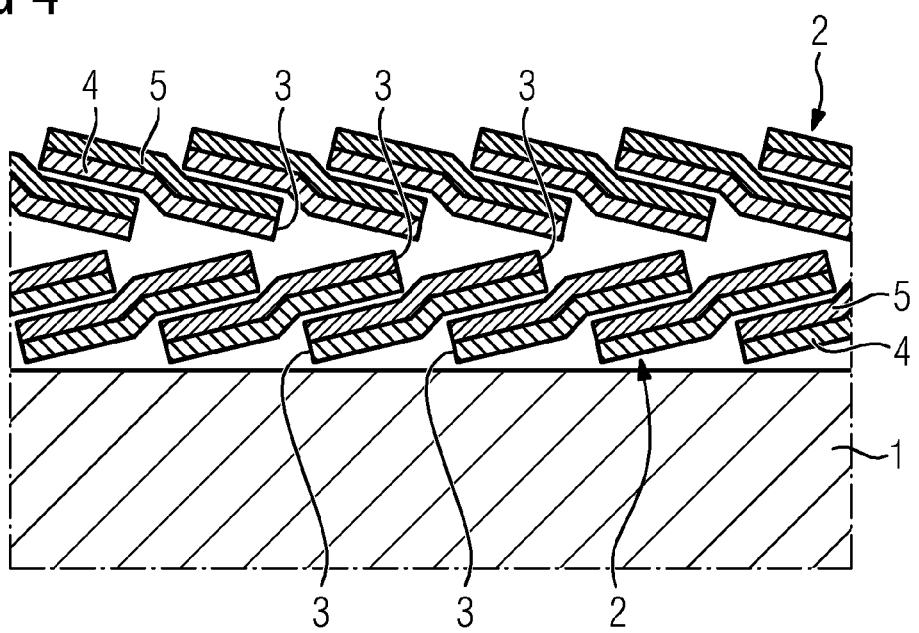
FIG. 4 shows a schematic sectional view of a subregion of a further insulated winding bar, which shows a second winding pattern.
Figure 5:
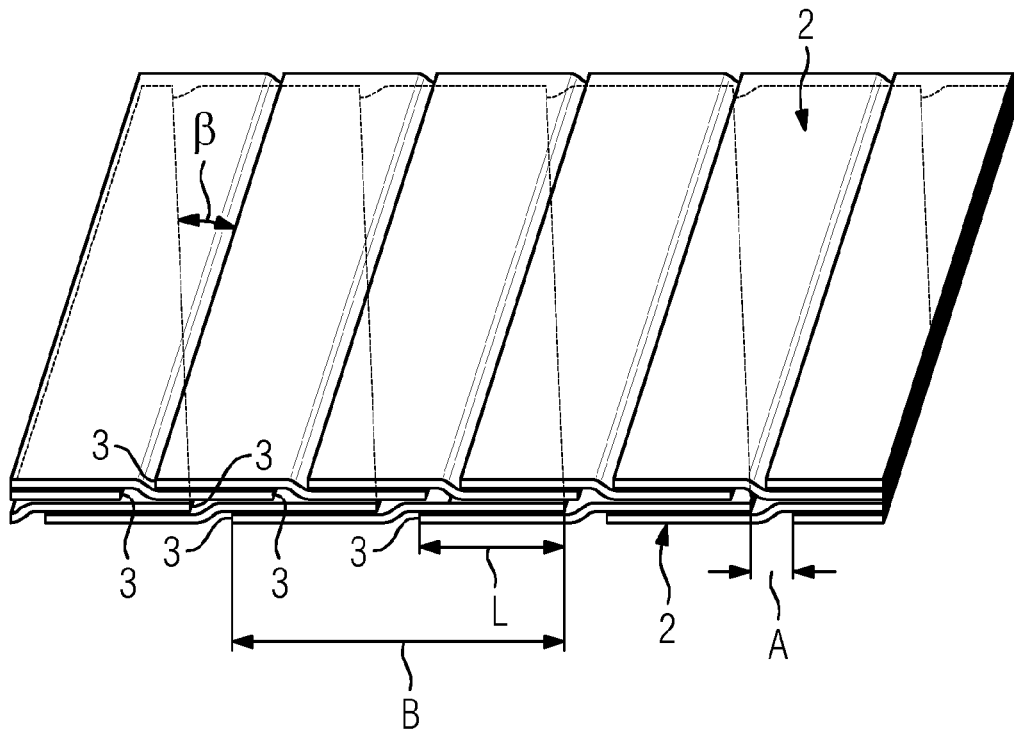
FIG. 5 shows a schematic perspective view of the subregion shown in FIG. 4.

FIGS. 4 and 5 show a winding bar 1 onto which two insulating tapes 2, likewise formed in two layers, were successively wound firstly in the negative X direction and then in the positive X direction in such a way that they are positioned above one another in the Z direction. Accordingly, the insulating tape edges 3 of the insulating tapes 2 arranged one above another cross at an angle (3, which corresponds to twice the angle α. Such a crossed winding is advantageous in that, following each winding operation of an insulating tape layer by using an appropriate insulating tape winding machine, no idle travel occurs.

Figure 6:
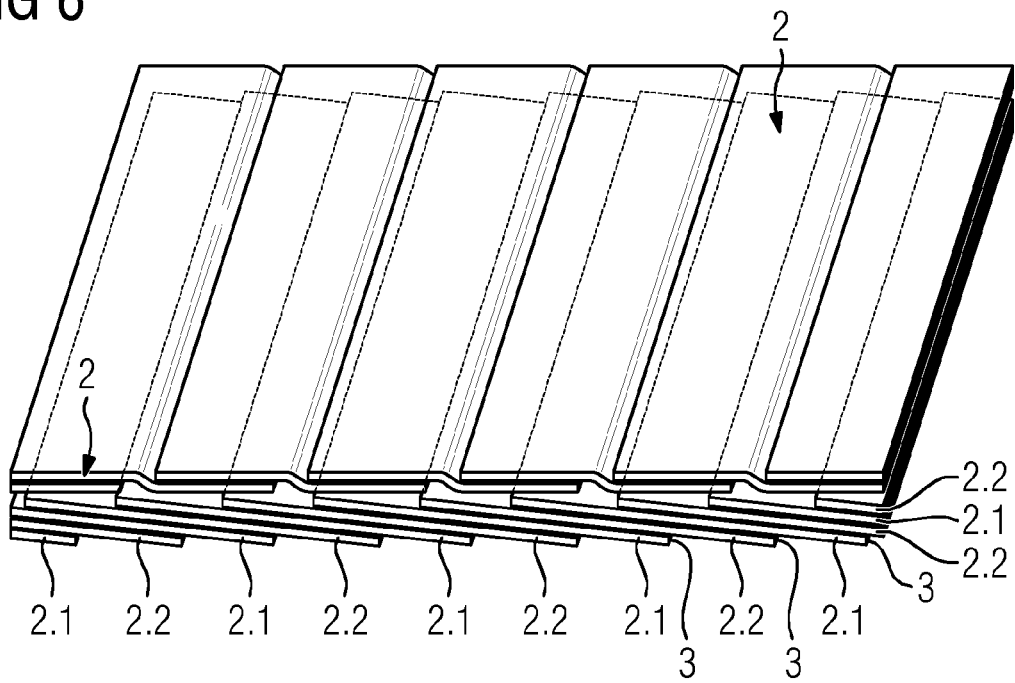
FIG. 6 shows a schematic perspective view of a subregion of a further insulated winding bar, which shows a third winding pattern.

FIG. 6 shows a further winding example, in which the lower insulating tape layer was wound in the positive X direction in an interleaved manner by the simultaneous use of two insulating tapes 2, while the upper insulating tape layer was wound in the positive X direction by using a single insulating tape 2.

In principle, the winding patterns illustrated in FIGS. 2 to 6 can be combined with one another as desired. The number of insulating tapes 2 used for stator winding insulation can be a plurality of 10 insulating tapes 2 arranged above one another and/or interleaved with one another. Following the winding of the insulating tapes 2, the latter are impregnated by using a resin.

During the generator operation, a structural change in the stator winding insulation takes place, which is brought about by electrical, thermal and chemical stresses. Signs of aging of the stator winding insulation are the consequence, for example in the form of cracks, delaminations, creases or the like. To determine the state of aging of the stator winding insulation and to avoid generator damage, it is necessary to detect such signs of aging and their extent as early as possible and, if necessary, to take countermeasures in good time.

In the following, with reference to FIGS. 7 to 10, the principle of a method according to one embodiment of the present invention for the non-destructive detection of signs of aging of stator winding insulation will be described.

Figure 7:
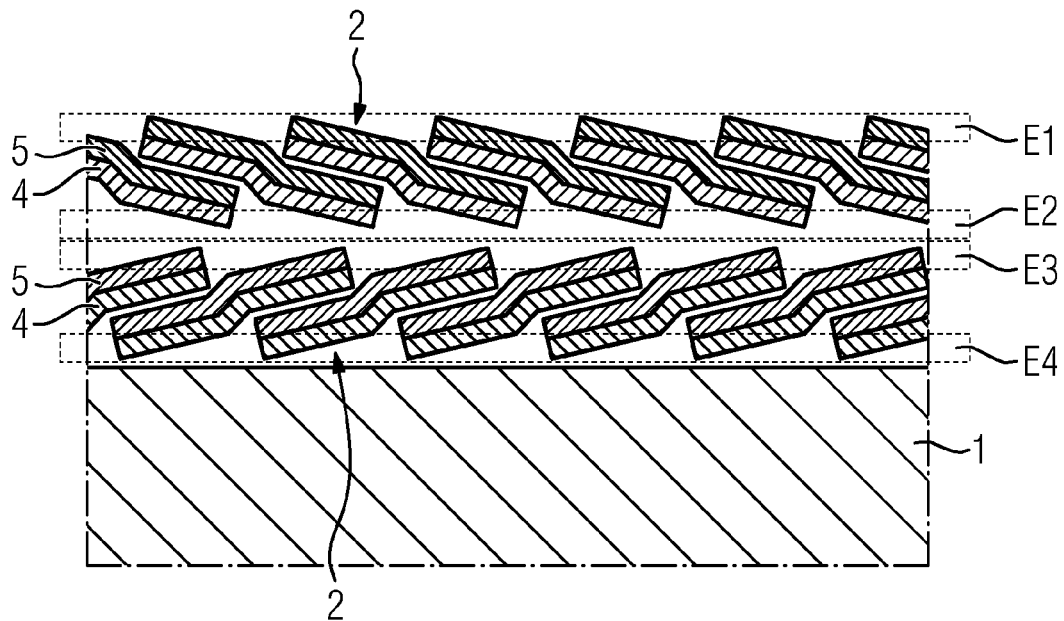
FIG. 7 shows a schematic sectional view of a winding bar having a winding pattern shown in FIGS. 4 and 5 during the performance of a method according to one embodiment of the present invention.

FIG. 7 shows a winding bar 1 of which the stator winding insulation is wound in a cross winding analogous to FIGS. 4 and 5 and which has two signs of aging. In a first step, the stator winding insulation is scanned, producing at least one scanning image set having a plurality of two-dimensional scanning images 6. The scanning is carried out in the present case by using terahertz testing technology, wherein the scanning images 6 of the scanning image set are recorded in the present case in four scanning planes E1 to E4 arranged one under another in the Z direction and each extending in an X-Y plane.

Figure 8:
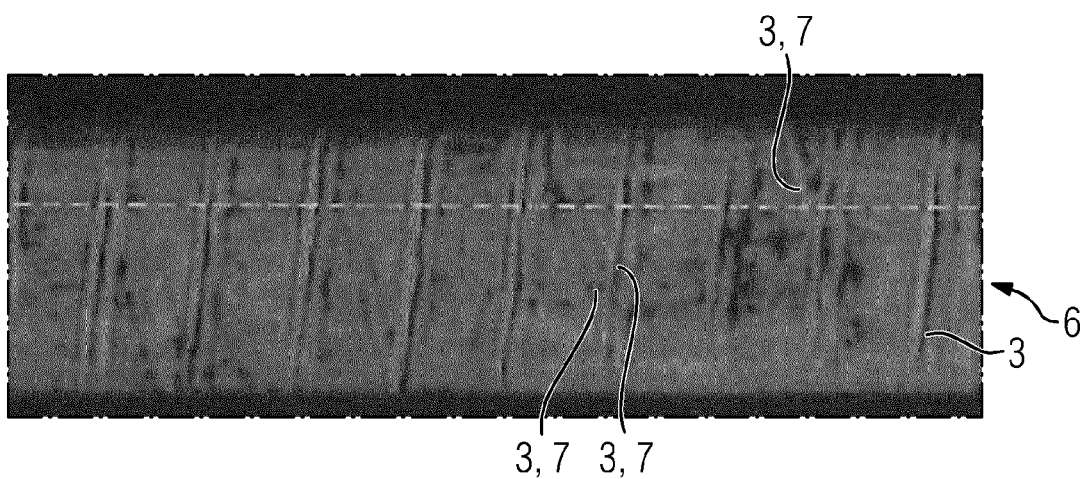
FIG. 8 shows an example of a view of a scanning image.

FIG. 8 shows by way of example such a scanning image 6 of undamaged insulation. By using FIG. 8, it can be seen that the scanning image 6 already has a multiplicity of inhomogeneities 7 because of the very complex winding structure, which leads to it being very difficult to distinguish inhomogeneities 7 brought about by signs of aging from structurally induced inhomogeneities 7, here in particular from the inhomogeneities 7 caused by the insulating tape edges 3 of the stator winding insulation.

To eliminate this problem, in a further step, by using a suitable algorithm in the individual scanning images 6, those inhomogeneities 7 that form recurring patterns and those inhomogeneities 7 that do not follow a recurring pattern are identified. In the scanning image 6 from the scanning plane E1, the inhomogeneities 7 representing the insulating tape edges 3 are identified as those with a regularly recurring pattern and are represented as lines 8 provided with markers A1, A2, A3, . . . An. Furthermore, the inhomogeneity 7.1.1 is identified as an inhomogeneity which cannot be assigned to a recurring pattern and is marked in color. In the scanning image 6.2 from the scanning plane E2, which lies one tape layer thickness deeper than the scanning plane E1, the inhomogeneities 7 brought about by insulating tape edges 3 are likewise identified as those with a recurring pattern, identified as lines 8 provided with markers As1, As2, As3, . . . Asn, and compared with the recurring pattern to be expected, which is calculated from the markers A1, A2, A3, . . . An and the tape width B of the insulating tape 2. Furthermore, the inhomogeneities 7.1.2 and 7.2.2 are identified as inhomogeneities which cannot be assigned to a recurring pattern and are marked in color. Also in the scanning image 6.3 from the scanning plane E3, the inhomogeneities 7 brought about by insulating tape edges 3 are identified as those with a recurring pattern and represented as lines 8 provided with markers B1, B2, B3, . . . Bn. Furthermore, the inhomogeneities 7.1.3 and 7.2.3 are identified as inhomogeneities which cannot be assigned to a regular pattern and are marked in color. In the scanning image 6.4 from the scanning plane E4, which lies one tape layer thickness deeper than the scanning plane E3, the inhomogeneities 7 brought about by insulating tape edges 3 are identified as a recurring pattern, represented as lines 8 provided with markers Bs1, Bs2, Bs3, . . . Bsn and compared with the recurring pattern which is to be expected, which is calculated from the markers B1, B2, B3, . . . Bn and the tape width B of the insulating tape 2. In addition, the inhomogeneity 7.2.4 is identified as an inhomogeneity which cannot be assigned to a recurring pattern and is marked in color.

Figure 9:
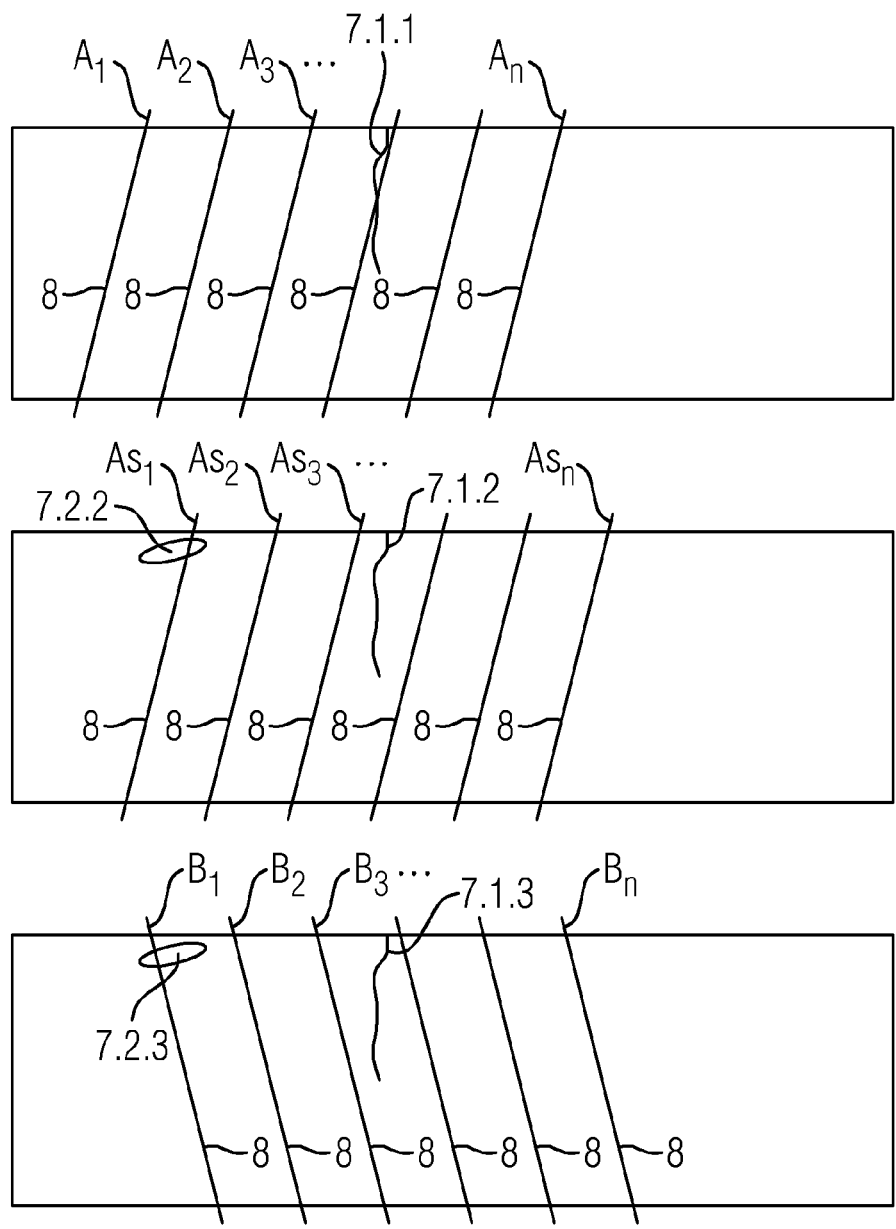
FIG. 9 shows a schematic view which shows scanning images processed according to the invention from the upper three scanning planes illustrated in FIG. 4.

FIG. 9 shows by way of example the scanning images 6.1, 6.2 and 6.3 from the scanning planes E1 to E3, which have now been cleaned by the algorithm and which are used as a basis for the subsequent analysis of the scanning images of the scanning image set for the detection of existing signs of aging of the stator winding insulation, wherein the inhomogeneities 7 assigned to a recurring pattern during the detection are ruled out as potential signs of aging, so that only the inhomogeneities 7.1.1 to 7.1.4 and 7.2.2 and 7.2.3 are detected as signs of aging.

By using the type and the position of the inhomogeneities 7.1.1 to 7.1.4 and 7.2.2 and 7.2.3, conclusions can be drawn, for example on the basis of the criteria described below.

Cracks are mostly sharp-edged, extend in the X or Y direction, which means that they can be distinguished from the insulating tape edges 3 extending at the angle α to the Y axis, and penetrate multiple insulating tape layers in the Z direction.

Delaminations mostly affect only a single layer and produce oval inhomogeneities in the scanning image.

Creases in the insulating tape 2 normally extend in the X direction, remain constant over multiple windings and fade away slowly in the Z direction.

Figure 10:
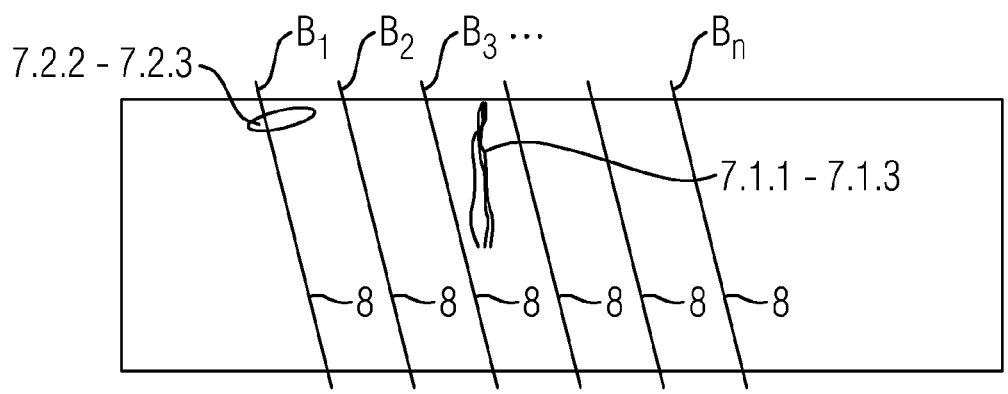
FIG. 10 shows a schematic view, which shows the scanning images illustrated in FIG. 9 in the superimposed state.

If the inhomogeneities 7.1.1 to 7.1.4 are viewed against this background, then these unambiguously identify a crack, see also FIG. 10 in this regard, in which the scanning images 6.1, 6.2 and 6.3 are arranged above one another according to FIG. 9. The inhomogeneities 7.2.2 and 7.2.3 can, however, be identified as delamination.

The detection of signs of aging, as well as the identification of the type of signs of aging, can be carried out by a person. However, they are advantageously likewise done automatically by using a suitable algorithm, which can be contained in the same computer program as the aforementioned algorithm. The algorithm can make access to databases, pattern recognition logic, data analyses or the like, which make it possible to identify and possibly to assess the type of signs of aging on the basis of the type of inhomogeneities and their position.

Even though the method has been described only with reference to the creation of a single scanning image set, it should be clear that a multiplicity of such scanning image sets can be created along the X direction of the winding bar 1 in order to subject the entire stator winding insulation to a test. Each of the scanning image sets produced is assigned to a specific region of the winding bar 1. In the present case, this assignment is made on the basis of the position of the scanning head at the time of the scanning operation of the individual scanning images 6 of the scanning image set and on the basis of the size of the image region of the scanning images 6. In this way, the identified signs of aging can be localized unambiguously.

The method according to the invention makes use of the fact that reflections and therefore inhomogeneities primarily occur at locations of large material property changes, such as, for example, along insulating tape edges. If the material property changes are of a recurring nature, then they are structurally induced and can be disregarded during the detection of signs of aging, which highly simplifies the analysis of the remaining inhomogeneities. During the scanning, different frequencies or further scanning parameters, such as, for example, angles of incidence, can be selected, for example those which permit a high resolution but do not enter so deeply into the component, or those which permit a low resolution but penetrate more deeply into the component for this purpose. A combination of the two frequencies and/or angles of incidence then permits optimum scan adjustment, depending on the testing object to be achieved.

Although the invention has been illustrated and described in more detail by means of the exemplary embodiment, the invention is not restricted by the examples disclosed and other variations can be derived therefrom by those skilled in the art without departing from the protective scope of the invention. In particular, the method according to the invention can also be used in other components which have recurring structures. Examples of such components are glass-fiber, carbon-fiber or polymer-fiber reinforced plastics, metal-reinforced plastics, ceramic fiber composite materials, laminates, wound bodies which are composed of webs, fibers, filaments or fabrics and, because of the arrangement of the fibers, tapes, fabric intermeshing, etc., have regularities and therefore recurring structures, sandwich constructions as a combination of different materials, components having a three-dimensional lattice structure, in particular 3D-printed components, etc. The method according to the invention can also be applied in 3D-printed components in which a three-dimensional lattice structure is produced, the regularity and recurring character of which are based on 3D models. This structure and a corresponding 3D model can, for example, have a location-dependent variation in the lattice structure in order to be adapted to the stresses to be expected by means, for example, of increasingly narrow intermeshing.

The invention claimed is:

1. A method for non-destructive detection of signs of aging of a component having regularly recurring structures, comprising:
   a) scanning the component in a region of the recurring structures in a plurality of scanning planes which extend parallel to one another, creating at least one scanning image set having a plurality of two-dimensional scanning images, wherein the scanning images show a multiplicity of inhomogeneities;
   b) automatically identifying those inhomogeneities that form recurring patterns and those inhomogeneities that do not follow a recurring pattern, using a suitable algorithm; and
   c) detecting signs of aging exclusively on the basis of those inhomogeneities identified in step b) that do not follow a recurring pattern;
   wherein the regularly recurring structures are one or more winding layers wound around a winding bar.

2. The method as claimed in claim 1,
   wherein the regularly recurring structures are multi-dimensionally produced structures.

3. The method as claimed in claim 1,
   wherein the scanning in step a) is carried out by using a terahertz, ultrasound or tomography testing technique or an optical analysis in accordance with reflection, absorption or transmission methods, or a combination of a plurality of these methods and techniques.

4. The method as claimed in claim 1,
   wherein the scanning image set produced in step a) is assigned to a specific region of the component.

5. The method as claimed in claim 1,
   wherein the detection carried out in step c) is done visually by a person,
   wherein during the detection the inhomogeneities identified in step b) that do not follow a recurring pattern are masked out of the scanning images or specially marked.

6. The method as claimed in claim 5,
   wherein the scanning images of the at least one scanning image set are displayed to the person carrying out the detection above one another and/or under one another on a monitor.

7. The method as claimed in claim 1,
   wherein the detection carried out in step c) is done automatically by using a further algorithm.

8. The method as claimed in claim 1,
   wherein the inhomogeneities identified in step b) that do not follow a recurring pattern are optically highlighted in the scanning images.

9. The method as claimed in claim 1,
   wherein a position and/or type and/or extent of the signs of aging detected in the context of the analysis are identified and stored.

10. A device,
    wherein the device is set up to carry out a method as claimed in claim 1.

11. The method as claimed in claim 1,
    wherein the regularly recurring structures are winding layers of an insulating tape of stator winding insulation or of a rotor cap.

12. The method as claimed in claim 2,
    wherein the regularly recurring structures are multi-dimensionally produced structures comprising 3D-printed rib, support, spring or supporting elements or structures which define cavities or channels.

13. The method as claimed in claim 8,
wherein the inhomogeneities identified in step b) that do not follow a recurring pattern are marked in color.

\* \* \* \* \*